(12) United States Patent
Strack

(10) Patent No.: US 9,682,732 B2
(45) Date of Patent: Jun. 20, 2017

(54) FULLY SELF-BALANCED HANDS-FREE PORTABLE VEHICLE

(71) Applicant: Jason Thomas Strack, Orland Park, IL (US)

(72) Inventor: Jason Thomas Strack, Orland Park, IL (US)

( * ) Notice: Subject to any disclaimer, the term of this patent is extended or adjusted under 35 U.S.C. 154(b) by 318 days.

(21) Appl. No.: 14/480,606

(22) Filed: Sep. 8, 2014

(65) Prior Publication Data

US 2015/0096820 A1   Apr. 9, 2015
US 2016/0368541 A9   Dec. 22, 2016

Related U.S. Application Data

(60) Provisional application No. 61/874,728, filed on Sep. 6, 2013.

(51) Int. Cl.

| | | |
|---|---|---|
| A63C 17/12 | (2006.01) | |
| B62D 31/00 | (2006.01) | |
| B60L 15/20 | (2006.01) | |
| B60L 11/18 | (2006.01) | |
| A63C 17/00 | (2006.01) | |
| G06F 11/14 | (2006.01) | |
| G11C 7/10 | (2006.01) | |
| B60L 3/00 | (2006.01) | |

(Continued)

(52) U.S. Cl.
CPC .......... *B62D 31/006* (2013.01); *A63C 17/008* (2013.01); *B60L 3/0076* (2013.01); *B60L 11/18* (2013.01); *B60L 11/1805* (2013.01); *B60L 15/2009* (2013.01); *B60L 15/2036* (2013.01); *B62D 51/02* (2013.01); *B62K 11/007* (2016.11); *G06F 11/1433* (2013.01); *G11C 7/1072* (2013.01); *B60L 2200/16* (2013.01); *B60L 2220/44* (2013.01); *B60L 2240/12* (2013.01); *B60L 2240/20* (2013.01); *B60L 2240/22* (2013.01); *B60L 2240/26* (2013.01); *B60L 2240/421* (2013.01); *B60L 2270/145* (2013.01); *Y02T 10/645* (2013.01); *Y02T 10/7005* (2013.01); *Y02T 10/72* (2013.01); *Y02T 10/7275* (2013.01)

(58) Field of Classification Search
CPC ..... A63C 17/008; A63C 17/12; A63C 17/011; A63C 17/015; B60L 3/0076; B60L 11/18; B60L 11/1805; B60L 15/2009; B60L 15/2036; B62D 31/006; B62D 51/02; B62K 11/007; G06F 11/1433; G11C 7/1072
USPC .................................................. 180/180, 181
See application file for complete search history.

(56) References Cited

U.S. PATENT DOCUMENTS

| 6,543,564 B1 | 4/2003 | Kamen et al. |
|---|---|---|
| 7,004,271 B1 | 2/2006 | Kamen et al. |

(Continued)

FOREIGN PATENT DOCUMENTS

| JP | H0692273 A | 4/1994 |
|---|---|---|
| JP | H0910375 A | 1/1997 |

(Continued)

*Primary Examiner* — John Walters
(74) *Attorney, Agent, or Firm* — Richards Patent Law P.C.

(57) ABSTRACT

The present disclosure provides a hands-free, self-balancing vehicle including a tiltable platform for a rider to stand on. The tiltable platform may tilt in any direction and direct the direction of motion of the vehicle. The vehicle is compact and may be disassembled for easy portability.

17 Claims, 5 Drawing Sheets

(51) Int. Cl.
*B62K 11/00* (2006.01)
*B62D 51/02* (2006.01)

(56) References Cited

U.S. PATENT DOCUMENTS

| | | | |
|---|---|---|---|
| 7,293,622 B1 * | 11/2007 | Spital | A63C 17/12 |
| | | | 180/180 |
| 7,303,032 B2 | 12/2007 | Kahlert et al. | |
| 7,458,435 B2 | 12/2008 | Negoro et al. | |
| 7,467,681 B2 | 12/2008 | Hiramatsu | |
| 7,481,291 B2 * | 1/2009 | Nishikawa | B62K 17/00 |
| | | | 180/181 |
| 7,703,568 B2 * | 4/2010 | Ishii | A63C 17/12 |
| | | | 180/218 |
| 7,784,206 B2 | 8/2010 | Trainer | |
| 7,811,217 B2 | 10/2010 | Odien | |
| 7,958,961 B1 | 6/2011 | Schade | |
| 8,322,478 B2 | 12/2012 | Kim | |
| 8,738,278 B2 * | 5/2014 | Chen | B62K 3/007 |
| | | | 180/218 |
| 8,978,791 B2 * | 3/2015 | Ha | B62H 1/00 |
| | | | 180/218 |
| 2005/0205310 A1 | 9/2005 | Pelz | |
| 2006/0249313 A1 * | 11/2006 | Kamen | A61G 5/046 |
| | | | 180/7.1 |
| 2009/0115149 A1 | 5/2009 | Wallis et al. | |
| 2011/0220427 A1 | 9/2011 | Chen | |
| 2013/0032422 A1 | 2/2013 | Chen | |

FOREIGN PATENT DOCUMENTS

| | | |
|---|---|---|
| JP | H1023613 A | 1/1998 |
| JP | 2006256401 | 9/2006 |
| WO | 9951484 A1 | 10/1999 |
| WO | 2011098935 A2 | 2/2011 |

* cited by examiner

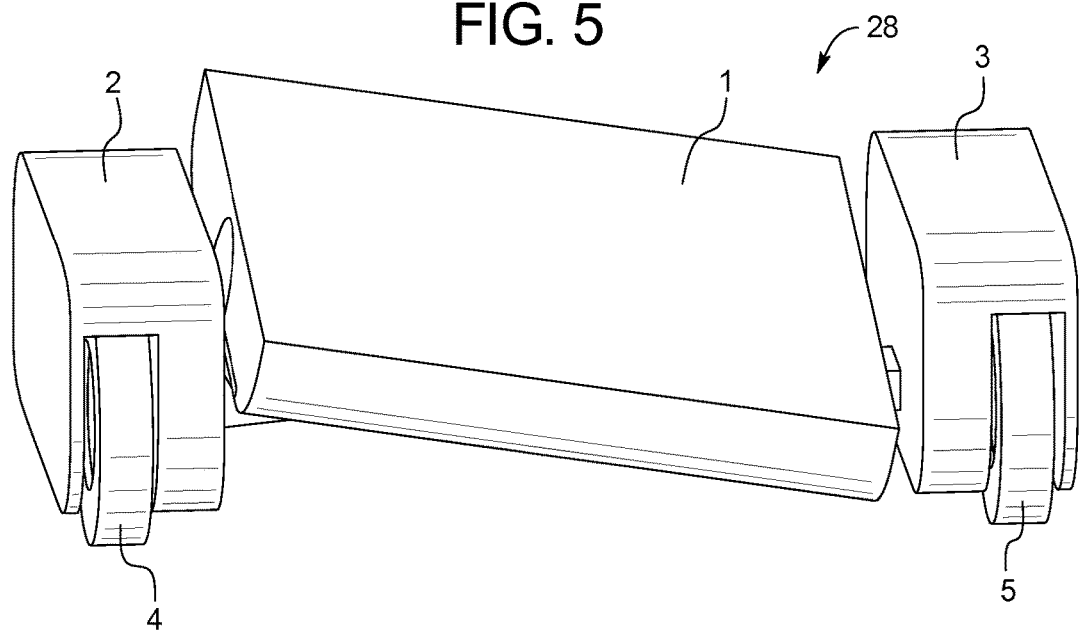
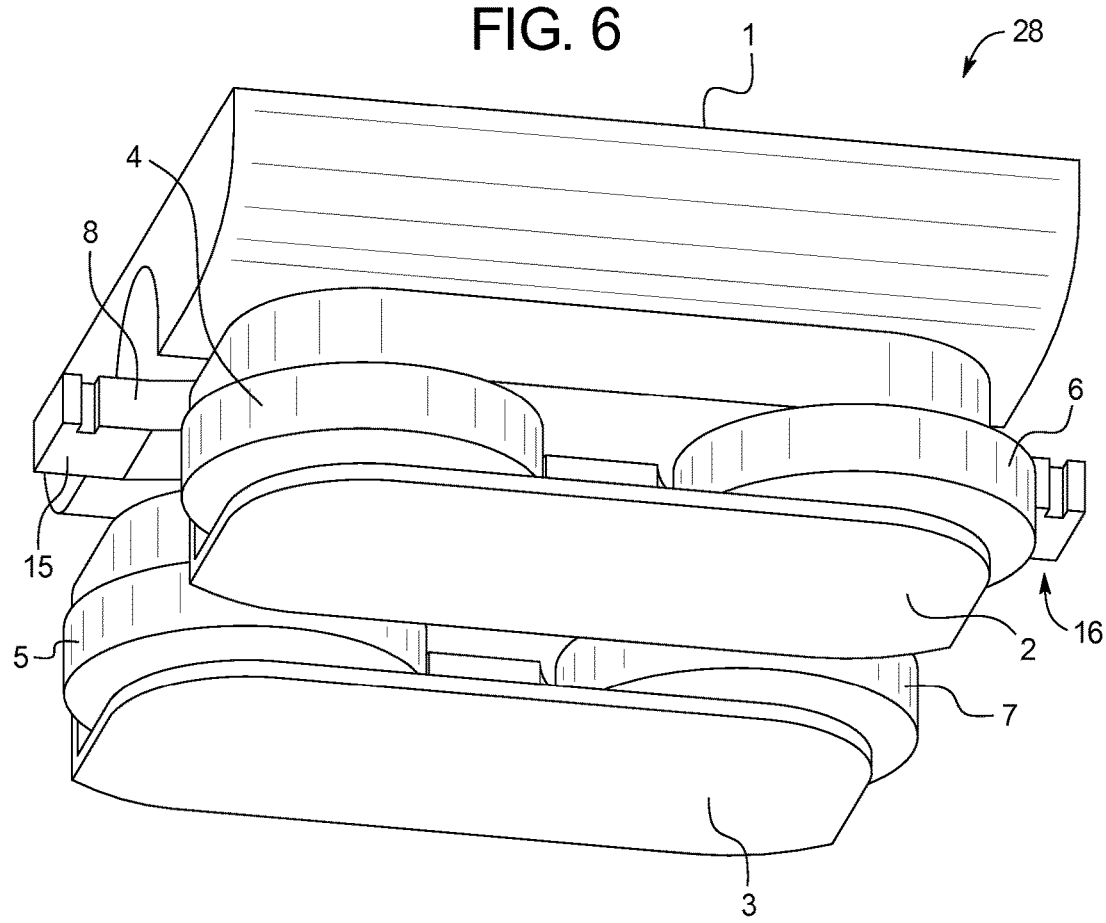

FULLY SELF-BALANCED HANDS-FREE PORTABLE VEHICLE

CROSS-REFERENCE TO RELATED APPLICATIONS

This application incorporates by reference and claims the benefit of priority to U.S. Provisional Application 61/886,604 filed on Sep. 6, 2013.

BACKGROUND OF THE INVENTION

The present subject matter relates generally to a vehicle capable of fully hands-free self-balanced travel. More specifically, the present invention relates to a vehicle that self-balances by having two independent motors accelerate the vehicle based on the tilt of a platform that the rider is on. Therefore a rider only needs to lean to fully control the vehicle.

Currently travelling relatively short distances can be inconvenient. Walking is slow, bikes and cars require parking, buses only leave at certain times and only go certain places, and small vehicles such as skateboards are somewhat difficult to use, especially in crowded areas. This is commonly referred to as the "last mile problem."

More recently, new vehicles which self-balance have been created in an attempt to help address this problem. The most well known self-balanced vehicle is commercially known as the "Segway". While relatively easy to control, it too must be parked like a car or bike. Other self-balancing vehicles eliminate the need to be parked by being hands-free. These vehicles are then small enough to be carried by a person in a way similar to how a skateboard can be carried. However, these vehicles do not self-balance in all directions, and so they are relatively difficult to balance on.

Accordingly, there is a need for a vehicle which is small enough to not require parking, yet is still easy to ride and capable of quickly transporting a person relatively short distances.

BRIEF SUMMARY OF THE INVENTION

To meet the needs described above and others, the present disclosure provides a highly portable small hands-free vehicle that is fully self-balancing, allowing for easy to use, quick, short distance transportation.

The hands-free vehicle contains a platform attached to a spring system that is capable of tilting in any direction. Tilting the platform directs the direction of motion of the vehicle. As a result, a rider only needs to lean to travel in the direction the rider leans. The vehicle may be self-balanced regardless of the direction being travelled. When the user wants to carry or store the vehicle, it can be rapidly disassembled into three parts for highly compact storage. When disassembled the vehicle is small and light enough to easily be carried in a standard sized backpack. Therefore, the vehicle is simple to use and does not require parking.

To accelerate forward, the rider simply leans forward while on the platform. To accelerate backward, the rider leans backward. To turn right or left, the rider leans right or left, respectively. If the rider leans in some combination of these four directions, the vehicle will accelerate in that direction as well. For example, if a rider leans sharply backward and relatively gently to the left the vehicle will accelerate significantly backwards and more mildly to the left. The vehicle may include a plurality of sensors that may rapidly and precisely measure tilt, any imbalance caused by rider leaning. To maintain speed, the rider simply stands upright, since no acceleration is required.

The vehicle stops in the same manner. To stop, the rider must simply lean in the direction opposite to the vehicle's current velocity. For example, if the rider is travelling forward, then the rider will need to lean backward until the velocity reaches zero. If the rider is travelling backward then the rider will need to lean forward until the velocity reaches zero.

Braking is achieved by having the two motors resist motion, not by mechanical friction braking. This is beneficial since, by eliminating friction brakes, the complexity of the vehicle is lessened. This makes the vehicle less expensive, smaller, and less prone to break. While mechanical brakes would provide added redundancy, they are not necessary. The vehicle does not typically travel very fast and, in the extremely unlikely event of a massive motor braking failure, a rider could always jump off, just as a skateboard rider could.

Since the vehicle contains acceleration sensors in the platform and in non-tiltable parts of the vehicle, the vehicle understands its orientation with respect to the platform and gravity. This allows the vehicle to self-balance even when traveling up or down a hill.

The vehicle's ability to self-balance is further improved by continuously monitoring the speed of the vehicle. Since the vehicle already contains speed-measuring sensors to allow for self-balancing when turning, this same information can be used to improve control of the vehicles acceleration. The information from speed sensors provides a feedback loop to more accurately control the speed of the vehicle.

By including two motors that are independently controlled, a zero turning radius is possible. This further improves the rider's control over the vehicle, since very precise movements and turns are possible.

The vehicle may be designed to include only one motor to power the vehicle. The vehicle may need another actuator for turning the vehicle by rotating a wheel or wheels, which would save on the cost of having a second powerful motor, gearbox, and additional electronics to control it. However, this alternative would introduce further complexity to the design. Also, the vehicle would no longer have the ability to turn with a zero turning radius.

Being fully hands-free improves usability, portability, and aesthetics. By being completely hands-free, the rider's hands can be used for anything else. It is common for people to use their hands for a variety of tasks while walking, and this vehicle allows for such activity while riding. Eliminating the use of things like handlebars also enables the vehicle to be lighter and smaller, while maintaining a low cost. The compact size makes the vehicle much easier to carry around, eliminating the need to park the vehicle. Additionally, it greatly improves aesthetics. Since the vehicle is a small device underneath a rider, the vehicle is not visually distracting. This is very different from a vehicle controlled by hands. These vehicles must connect the ground to a rider's hands, and so these vehicles will span a significant amount of the rider's body.

Being hands-free does however eliminate the added stability and control that handlebars offer. This loss of stability is compensated for by the vehicle's ability to rapidly and accurately measure and control the current velocity and acceleration. Additionally control and stability is enhanced by the platform being relatively long and wide, giving plenty of room for the for a rider's feet to be positioned naturally.

The vehicle is also capable of being rapidly assembled and disassembled into three pieces. This increases the portability of the vehicle, because when the vehicle is disassembled it occupies less volume. This is important when carrying the vehicle in a backpack or storing the vehicle, because available space is often highly limited. Because most of the vehicle can be made of strong and light materials such as carbon fiber, the mass of the vehicle can be plenty light enough to allow for easy portability. If a rider cannot carry the vehicle, then parking for the vehicle must be found. This would cause the vehicle to be often much less practical to use.

For additional safety and ease of use, the sensors within the vehicle can sense when a rider is on the vehicle. If the sensors detect that no one is on the platform, the vehicle automatically brakes or stops motion, which makes it easier to get on and off of the vehicle.

Since the tiltable platform is attached to the rest of the vehicle by a spring system, the rider experiences a smoother ride because the spring system also acts as a suspension system. The suspension system can be enhanced by adding one or more dedicated shock absorbers.

By having the appropriate stiffness and positioning of the springs certain rotations and translations of the platform can be made to be easier than others. This allows the platform to be stable and not rotate in undesirable ways, yet still be tiltable when the rider's weight is on the platform.

The vehicle may include two or more wheels. For example, by having at least three wheels, the vehicle may be passively statically stable. A three or greater wheeled vehicle can stand upright when not in motion. This allows for the vehicle to be easier to control than if it had only two wheels, especially when the rider is getting on and off of the vehicle.

The vehicle may include four wheels, wherein two of the four wheels can be independently controlled by two motors. This allows the vehicle to be compact and symmetrical. The four-wheeled vehicle also benefits aesthetically by including the same number of wheels as the vast majority of automobiles.

A two-wheeled version of the vehicle may be more compact. While it is less stable when not actively balanced and motionless, it can still be stable when actively balanced by the motors. By including only two wheels, an aesthetic advantage is gained in that the vehicle's ability to actively self-balance a rider will be more apparent. In certain examples, the two-wheeled implementation may be desirable over the four-wheeled version based on the benefits of improved aesthetics and small reduction in size that out weigh the disadvantages of lesser balance and control.

Being small and simple allows the vehicle to be relatively inexpensive and easy to manufacture, which offsets much of the costs of adding self-balancing functionality to the vehicle.

In an embodiment, the vehicle includes a tiltable platform for receiving a rider's feet, wherein, when the vehicle is in a neutral position, a top surface of the tiltable platform is coplanar with a horizontal plane, wherein the tiltable platform is configured to tilt in at least four directions. The vehicle also includes a first right wheel in communication with a right motor, wherein the tiltable platform is connected to the right wheel, and a first left wheel in communication with a left motor, wherein the tiltable platform is connected to the left wheel. The planar position of the top surface of the tiltable platform relative to the horizontal plane indicates the acceleration of the vehicle. Alternatively, or in addition to, the planar position of the top surface of the tiltable platform relative to the horizontal plane indicates the direction of movement of the vehicle.

In an example, a first spring connects the tiltable platform to a support beam including a first end and second end, wherein the first end of the support beam is attached to a right casing including the right wheel and the right motor, wherein the second end of the support beam is attached to a left casing including the left wheel and the left motor.

A second spring may connect the tiltable platform to a support beam, wherein the first spring and second spring are perpendicular to each other.

The vehicle may include an acceleration sensor in communication with a control system, wherein the acceleration sensor is configured to detect the position of the tiltable platform relative to the horizontal plane, wherein the control system is configured to: receive the position information from the acceleration sensors, determine acceleration information from the position information, and adjust the mechanical motion of the right motor and left motor based on the acceleration information.

In an example, the plurality of directions includes forward, backwards, right, and left. The tiltable platform may tilt in any direction within 360 degrees.

The vehicle may also include at least one battery connected to the right motor and left motor. In an example, the vehicle may also include a pressure sensor connected to the tiltable platform, wherein, when the pressure sensor detects no pressure on the tiltable platform, the vehicle automatically stops motion.

The right wheel and the left wheel may fold under the tiltable platform when the vehicle is not in use. Alternatively, or in addition to, the right wheel and the left wheel may detach from the tiltable platform when the vehicle is not in use.

In an embodiment, the vehicle includes a tiltable platform for receiving a rider's feet, wherein, when the vehicle is in a neutral position, a top surface of the tiltable platform is coplanar with a horizontal plane, wherein the tiltable platform is configured to tilt in at least four directions, wherein the planar position of the top surface of the tiltable platform relative to the horizontal plane indicates the acceleration of the vehicle. The vehicle also includes a tilt sensor connected to the tiltable platform, at least one right wheel in communication with a right motor, wherein the tiltable platform is connected to the right wheel, and at least one left wheel in communication with a left motor, wherein the tiltable platform is connected to the left wheel. The vehicle also includes a control system in communication with the tilt sensor, the right wheel, the right motor, the left wheel, and the left motor, wherein the control system is configured to: receive a position information from the tilt sensor, determine acceleration information from the position information, adjust the mechanical motion of the right motor and the left motor based on the acceleration information.

The vehicle may include a second right wheel and a second left wheel, wherein the second right wheel is connected to a right magnet in communication with a right magnetic sensor, wherein the second right wheel is connected to a left magnet in communication with a left magnetic sensor, wherein the right magnetic sensor and left magnetic sensor are in communication with the control system, wherein the control system is configured to: receive magnetic information from the right magnetic sensor and the left magnetic sensor, determine an angular velocity of the vehicle based on the magnetic information, and adjust the mechanical motion of the right motor and the left motor based on the angular velocity.

The tiltable platform may tilt in any direction within 360 degrees. The vehicle may include a pressure sensor connected to the tiltable platform, wherein the pressure sensor is in communication with the control system, wherein, when the pressure sensor detects zero pressure on the tiltable platform, the control system powers off the right motor and the left motor.

An object of the invention is to provide a solution to conveniently travelling short distances faster than walking.

Another object of the invention is for the vehicle to be easy to ride, even in high congestion areas.

An advantage of the invention is that it provides a platform to stand on which can tilt in any direction, allowing a rider to lean in any direction while still standing straight up. This makes balancing much easier.

Another advantage of the invention is that it is capable of fully self-balancing a rider even when turning. This is achieved by measuring both the orientation of the platform and rest of vehicle relative to gravity as well as the speed of the motors. Two independent motors then power the vehicle based on the information from the sensors.

A further advantage of the invention is that by containing two independently controlled motors, the vehicle is capable of turning with a minimum of a zero turning radius which further improves control when riding in congested areas.

Yet another advantage of the invention is that it provides a spring system connecting the platform to the rest of the vehicle, which in addition to allowing the platform to lean in all directions also makes riding more pleasant by acting as a suspension system. The suspension system can be enhanced by adding one or more dedicated shock absorbers.

Another advantage of the invention is that it may be disassembled into three pieces, allowing the vehicle to easily fit in a person's backpack. Therefore, the vehicle is highly portable and does not require parking.

Additional objects, advantages and novel features of the examples will be set forth in part in the description which follows, and in part will become apparent to those skilled in the art upon examination of the following description and the accompanying drawings or may be learned by production or operation of the examples. The objects and advantages of the concepts may be realized and attained by means of the methodologies, instrumentalities and combinations particularly pointed out in the appended claims.

BRIEF DESCRIPTION OF THE DRAWINGS

The drawing figures depict one or more implementations in accord with the present concepts, by way of example only, not by way of limitations. In the figures, like reference numerals refer to the same or similar elements.

FIG. 5 is a perspective view of an embodiment of the vehicle disclosed herein with the platform tilted.

FIG. 6 is a perspective view of an embodiment of the vehicle disclosed herein illustrating the vehicle disassembled for storage.

DETAILED DESCRIPTION OF THE INVENTION

Figure 1:
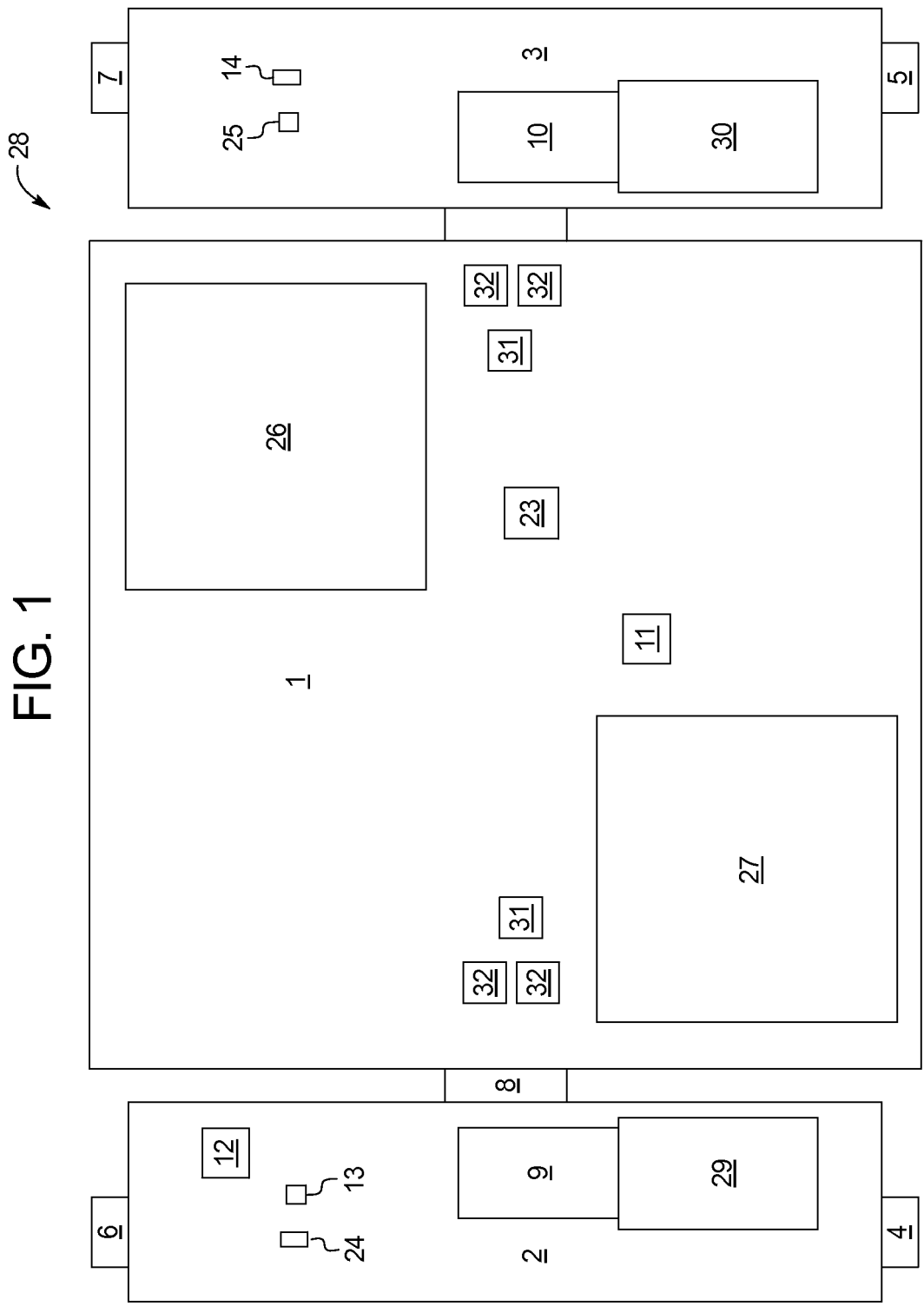
FIG. 1 is a top view of an embodiment of the vehicle disclosed herein, wherein the view schematically depicts possible positions of the internal electronics.
Figure 2:
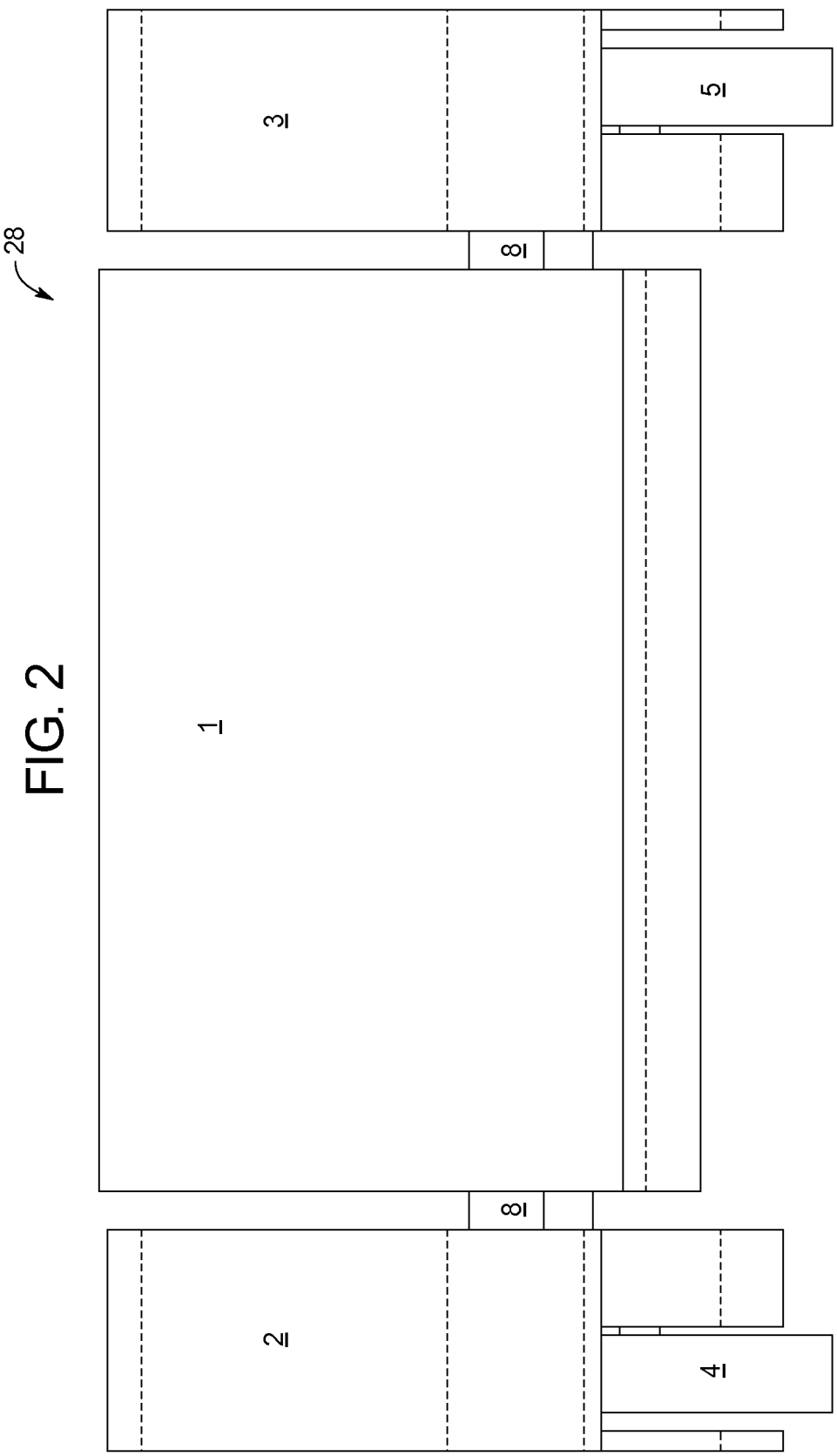
FIG. 2 is a front view of an embodiment of the vehicle disclosed herein.
Figure 3:
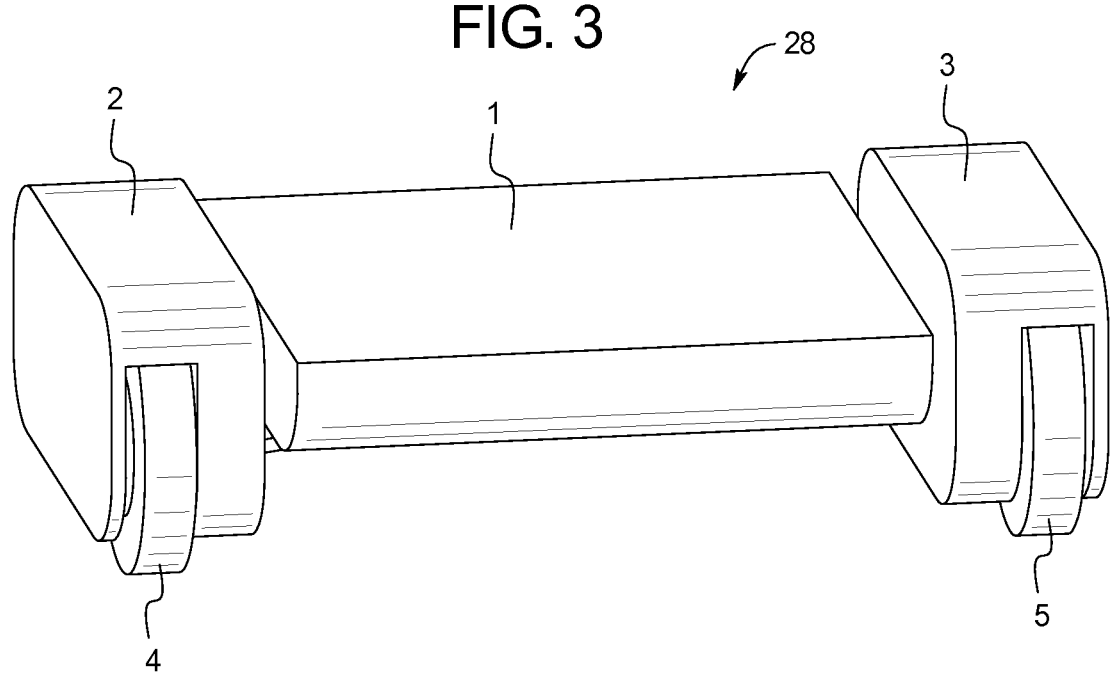
FIG. 3 is a perspective top view of an embodiment of the vehicle disclosed herein.
Figure 9:
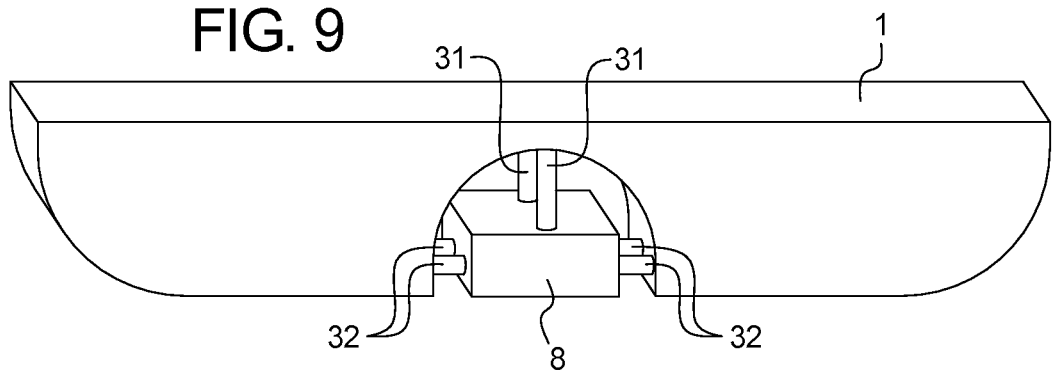
FIG. 9 is a perspective view of an embodiment of the spring system disclosed herein that is connecting a support beam to a platform.

FIGS. 1-4 illustrate examples of a four-wheeled implementation of the vehicle 28. As shown in FIG. 1, the vehicle 28 includes a tiltable platform 1, which is connected to a support beam 8 by a spring system 31, 32, as depicted in FIG. 9. The support beam 8 is then attached to right casing 2 and left casing 3, wherein the casings 2, 3 are attached to the motors 9, 10, gearboxes 28, 30 and wheels 4, 5, 6, 7. The gearboxes 28, 30 may be replaced with belt systems, chain systems, other suitable rpm reduction methods, or even in some cases be eliminated. Of course, the tiltable platform 1 may be connected to the right casing 2 and left casing 3 by any suitable connection. The right casing 2 may include, or be connected to, a right motor 9 and the left casing 3 may include, or be connected to, a left motor 10. In addition, the right casing 2 may include or connect to a right wheel 6, and the left casing 3 may include or connect to a left wheel 7. In an example, the support beam 8 may be directly connected to the right wheel 6 and left wheel 7. Finally, the vehicle 28 may be powered by a battery 27, which may also be contained in the tiltable platform 1.

The vehicle 28 may include a control system 26 that is in communication with various sensors and controls the movement of the vehicle 28. As shown in FIG. 1, the control system may be positioned within the tiltable platform 1. However, it is contemplated the control system 26 may be positioned anywhere within the vehicle 28, or even outside of the vehicle 28, wherein the control system 26 is not physically connected to the vehicle 28. Similarly, any of the sensors disclosed herein may be in physical communication or wireless communication with the control system 26.

For example, the vehicle 28 may include tilt sensors 11 (such as an accelerometer and/or gyroscope) in the tiltable platform 1, as well as tilt sensors 12 in a non-tiltable part of the vehicle 28. The tilt sensors 11, 12 may be in communication with the control system 26. The position of the tilt sensors 12 in or on non-tiltable parts of the vehicle 28 allows the control system 26 to determine to what degree and direction the platform 1 is tilted with respect to the rest of the vehicle 28, as well as how the vehicle 28 is oriented with respect to gravity. In addition, the control system 26 may determine when the vehicle 28 is going over a non-flat surface, such as a hill, based on the combination of tilt data from the tilt sensors 11, 12. The tilt data may be used by the controller to adjust the mechanical motion of the right motor 4 and left motor 5 as appropriate. For example, the degree of tilt may indicate the acceleration, speed or velocity intended by the rider, and/or the direction of tilt may indicate the direction of motion by the rider.

In addition to the tilt sensors 11, 12, the vehicle 28 may also contain a right magnetic sensor 13 and left magnetic sensor 14, both in communication with the control system 26. The magnetic sensors 13, 14 may also be any suitable tachometer, including but not limited to opto-isolator sensor and/or a Hall effect magnetic sensor. The magnetic sensors 13, 14 detect a right magnet 24 and a left magnet 25, respectively, attached to the two non-motor connected wheels 6,7. Such configuration allows the control system 26 to measure the velocity of the vehicle 28. Since angular acceleration is equivalent to velocity squared divided by the turning radius, the control system 26 may determine the current velocity to adjust the mechanical motion of the vehicle 28 to self-balance the rider when turning. If the rider leans sideways the vehicle 28 must have angular acceleration to offset the imbalance caused by leaning. For example, if the rider leans to the right and the vehicle 28 is not moving, the rider will be off balance by being forced to the right. However, if the vehicle 28 is turning to the right while moving forward, then the rider will be forced to the left with respect to the vehicle 28 as a result of this turning. If the vehicle 28 properly offsets these apparent forces, then the rider will be balanced.

The vehicle 28 may also include a pressure sensor 23 that enables the vehicle 28 to determine whether a rider is on the vehicle 28, wherein the pressure sensor 23 is in communication with the control system 26. The control system 26 may cause the mechanical motion of the vehicle 28 to automatically brake or stop motion when the pressure sensor 23 detects a rider is not on the vehicle 28. As a result, a rider may mount and dismount the vehicle 28 without risk of an accident.

Figure 4:
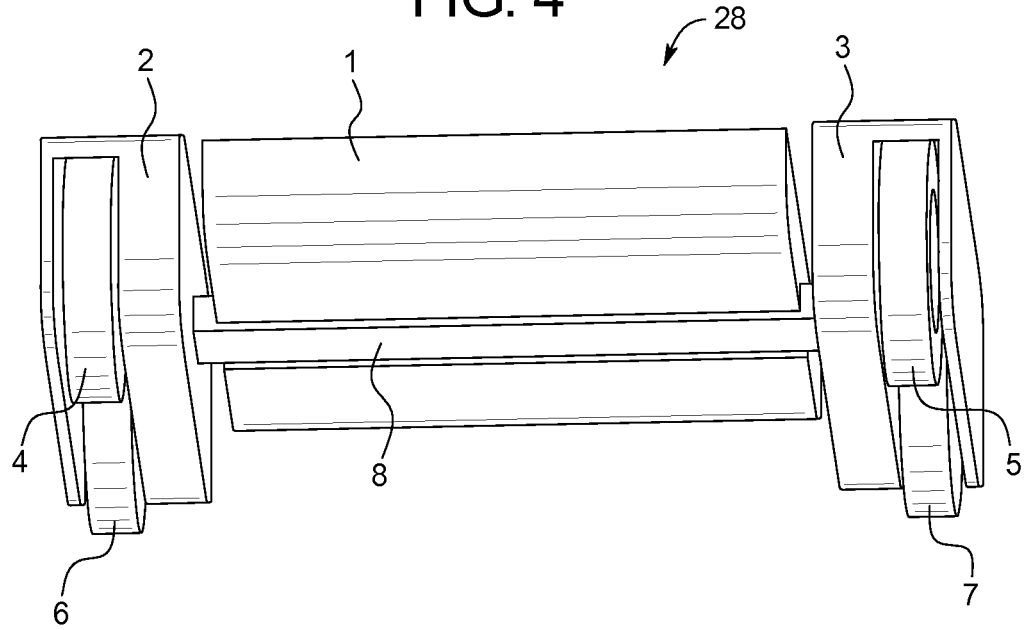
FIG. 4 is a perspective bottom view of an embodiment of the vehicle disclosed herein.

As shown in FIG. 4, the support beam 8 is connected to the platform 1 by a spring system 31,32. The tiltable platform 1 is capable of tilting in any direction several degrees without contacting the support beam 8, the ground, or any other part of the vehicle 28.

FIG. 5 illustrates the vehicle 28 with the platform 1 being tilted forward and to the left. As already explained, the platform 1 may tilt in any direction within 360 degrees. In other words, the tiltable platform 1 can tilt in any combination of either direction of the fore and aft plane and either direction of the side-to-side plane.

FIG. 6 illustrates the vehicle 28 disassembled into three pieces. The disassembly is advantageous when carrying or storing the vehicle 28, as it is small enough to fit in a common backpack. The right attachment mechanism 15 and left attachment mechanisms 16 disconnect from the right wheel and motor casing 2 and left wheel and motor casing 3, respectively, when disassembling the vehicle. In yet another embodiment, the right wheel 2 and left wheel 3 fold under the tiltable platform 1 for portability. In other words, in such example, the right wheel and motor casing 2 and left wheel and motor casing 3 do not completely disconnect from the tiltable platform 1. The attachment mechanisms 15,16 may attach in various suitable ways, such as with seatbelt buckles and clips or with thumb screws.

Figure 7:
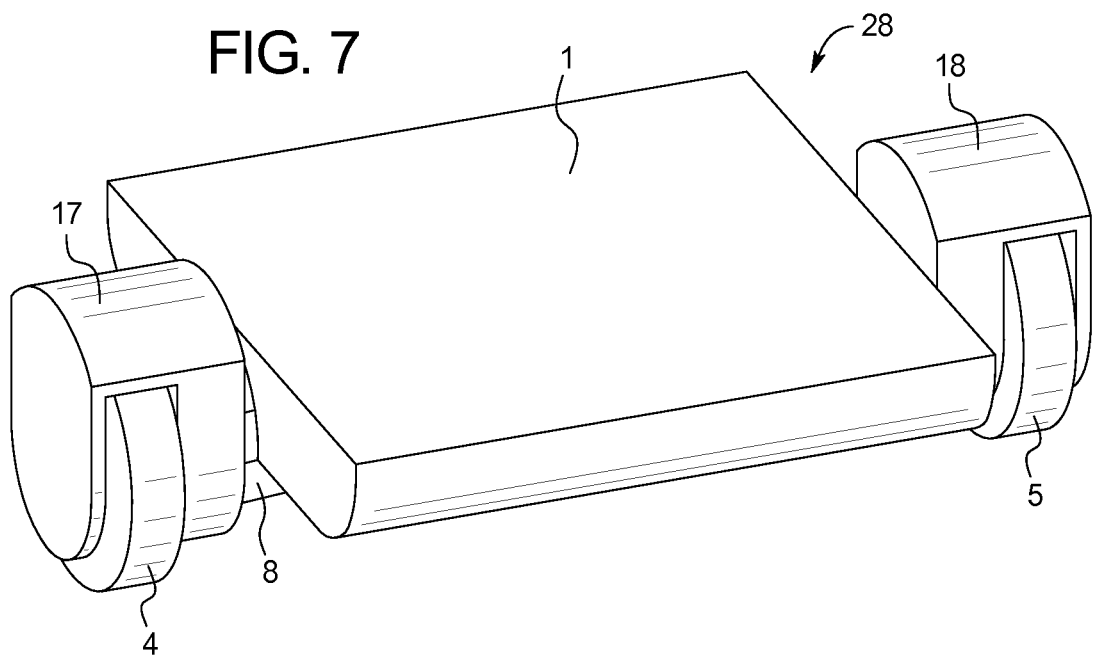
FIG. 7 is a perspective view of an embodiment of the vehicle disclosed herein including a two-wheeled implementation.

FIG. 7 illustrates an alternative implementation of the vehicle 28 that only includes two wheels. This design has smaller wheel and motor casings 17, 18 because two less wheels are used, and does sacrifice some stability as it is no longer passively statically stable as the four-wheeled implementation. Apart from the two fewer wheels, this two-wheel vehicle 28 design is substantially the same as the four-wheeled approach. It is also contemplated that the vehicle 28 may include only three wheels, wherein the three-wheel vehicle 28 has a combination of stability and portability.

Figure 8:
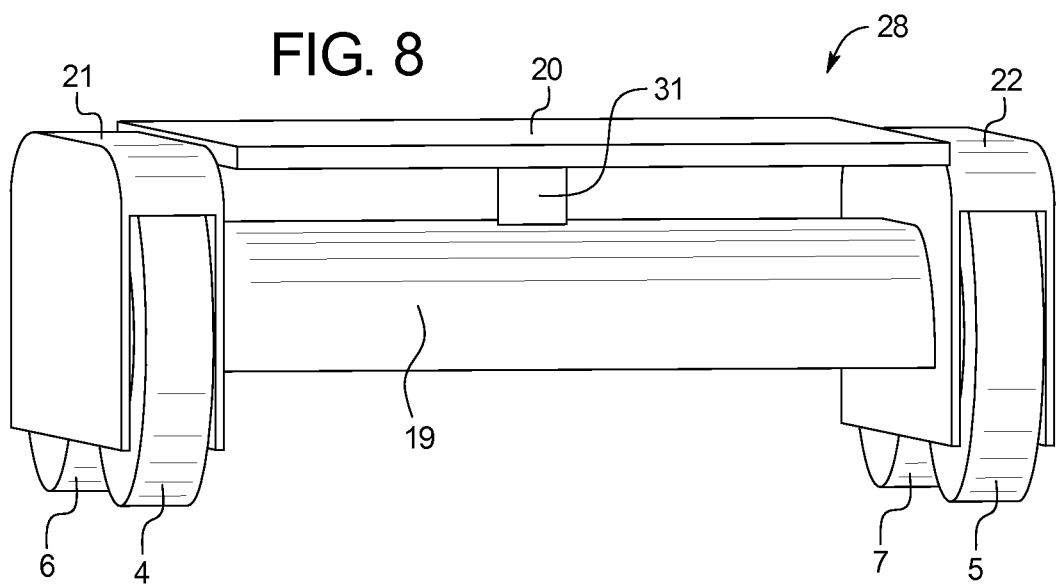
FIG. 8 is a perspective view of an embodiment of the vehicle disclosed herein that includes a thin platform.

FIG. 8 illustrates yet another alternative implementation where the tiltable platform 20 is very thin. Instead of a support beam 8, a larger base 19 is connected to the platform 20 by spring system 31 and allows for motors 4, 5 to be contained in the base 19 (and not in the encasings of the wheels and motors 2, 3 as shown in FIG. 1-7). Such configuration allows for the wheel encasing 21, 22 to be much smaller. In spite of this size reduction, this alternative implementation of the vehicle 28 is generally less portable owing to the fact that disassembling the vehicle 28 will lead to much less benefit in terms of volume reduction than the standard implementation of the vehicle.

FIG. 9 illustrates a possible configuration of the spring system 31,32. Springs 31 connect to the top of the support beam 8 and the bottom of the platform 1. If the combined spring constant of these springs 31 is multiple times greater than the rider's weight per inch then springs 31 will compress much less than an inch when the rider steps on the vehicle 28. However, if these springs 31 are close enough to the center of the support beam 8 and platform 1, then the platform 1 will still be able to tilt in the side-to-side directions relatively easily due to the mechanical advantage and geometry of the system. If it is desired for more force to be required for the platform 1 to tilt in this direction so that the rider does not unintentionally tilt the platform 1, then the springs 31 can be simply separated further apart from the center of the platform 1 and support beam 8.

Tilt in the fore and aft directions, as well as rotation about the axis parallel to the rider's length will not be significantly restricted by these springs 31. This is because of the considerable mechanical advantage and from the geometry of the spring placement when performing these rotations. Therefore, the vehicle 28 may include additional springs 32 perpendicular to springs 31 such that the springs 31, 32 are pointing toward the fore and aft of the vehicle 28. When the platform 1 tilts in the fore and aft directions, springs 32 will be greatly stretched and or compressed, which will allow for greater resistance for tilt in the fore and aft directions than springs arranged as springs 31 are if they have similar spring constants. If tilting in the fore and aft direction does not have enough resistance, then the rider may have greater difficulty balancing since the rider may tilt the platform 1 unintentionally.

Additionally, since no mechanical or geometric advantage is gained for rotation about the axis parallel to the length of the rider's body, springs 32 will virtually eliminate the vehicles ability to rotate this way, provided that they have a spring constant relatively similar to springs 31. This is generally advantageous because if the platform 1 rotates significantly in this way more sensors and logic would be required for the vehicle to self-balance. Also it will be more complex for the rider to balance on the vehicle 28 since the platform 1 could rotate significantly in an additional way.

It should be noted that various changes and modifications to the embodiments described herein will be apparent to those skilled in the art. Such changes and modifications may be made without departing from the spirit and scope of the present invention and without diminishing its attendant advantages. For example, various embodiments of the system and device may be provided based on various combinations of the features and functions from the subject matter provided herein.

I claim:

1. A vehicle comprising:
   a tiltable platform for receiving a rider's feet, wherein, when the vehicle is in a neutral position, a top surface of the tiltable platform is coplanar with a horizontal plane, wherein the tiltable platform is configured to tilt in at least four directions;
   a first right wheel in communication with a right motor, wherein the tiltable platform is connected to the right wheel; and
   a first left wheel in communication with a left motor, wherein the tiltable platform is connected to the left wheel,
   a first spring connects the tiltable platform to a support beam including a first end and second end, wherein the first end of the support beam is attached to a right casing including the right wheel and the right motor, wherein the second end of the support beam is attached to a left casing including the left wheel and the left motor;

wherein a planar position of the top surface of the tiltable platform relative to the horizontal plane indicates the acceleration of the vehicle.

2. The vehicle of claim 1 wherein a second spring connects the tiltable platform to a support beam, wherein the first spring and the second spring are perpendicular to each other.

3. The vehicle of claim 1 further comprising an acceleration sensor in communication with a control system, wherein the acceleration sensor is configured to detect the planar position of the tiltable platform relative to the horizontal plane, wherein the control system is configured to:
receive position information from the acceleration sensors;
determine acceleration information from the position information; and
adjust mechanical motion of the right motor and left motor based on the acceleration information.

4. The vehicle of claim 1 wherein the at least four directions includes forward, backwards, right, and left.

5. The vehicle of claim 1 wherein the tiltable platform may tilt in any direction within 360 degrees.

6. The vehicle of claim 1 further including at least one battery connected to the right motor and the left motor.

7. The vehicle of claim 1 further including a pressure sensor connected to the tiltable platform, wherein, when the pressure sensor detects no pressure on the tiltable platform, the vehicle automatically stops motion.

8. The vehicle of claim 1 wherein the right wheel and the left wheel may fold under the tiltable platform when the vehicle is not in use.

9. The vehicle of claim 1 wherein the right wheel and left wheel may detach from the tiltable platform when the vehicle is not in use.

10. The vehicle of claim 1 wherein the planar position of the top surface of the tiltable platform relative to the horizontal plane indicates a direction of movement of the vehicle.

11. A vehicle comprising:
a tiltable platform for receiving a rider's feet, wherein, when the vehicle is in a neutral position, a top surface of the tiltable platform is coplanar with a horizontal plane, wherein the tiltable platform is configured to tilt in at least four directions, wherein a planar position of the top surface of the tiltable platform relative to the horizontal plane indicates the acceleration of the vehicle;
a tilt sensor connected to the tiltable platform;
at least one right wheel in communication with a right motor, wherein the tiltable platform is connected to the right wheel;
at least one left wheel in communication with a left motor, wherein the tiltable platform is connected to the left wheel; and
a control system in communication with the tilt sensor, the right wheel, the right motor, the left wheel, and the left motor, wherein the control system is configured to:
receive a position information from the tilt sensor;
determine acceleration information from the position information; and
adjust the mechanical motion of the right motor and the left motor based on the acceleration information;
further comprising a second right wheel and a second left wheel, wherein the second right wheel is connected to a right magnet in communication with a right magnetic sensor, wherein the second right wheel is connected to a left magnet in communication with a left magnetic sensor, wherein the right magnetic sensor and the left magnetic sensor are in communication with the control system, wherein the control system is further configured to:
receive magnetic information from the right magnetic sensor and the left magnetic sensor,
determine an angular velocity of the vehicle based on the magnetic information, and
adjust the mechanical motion of the right motor and the left motor based on the angular velocity.

12. The vehicle of claim 11 wherein the tiltable platform may tilt in any direction within 360 degrees.

13. The vehicle of claim 11 further including a pressure sensor connected to the tiltable platform, wherein the pressure sensor is in communication with the control system, wherein, when the pressure sensor detects zero pressure on the tiltable platform, the control system powers off the right motor and the left motor.

14. The vehicle of claim 11 wherein the right wheel and the left wheel may fold under the tiltable platform when the vehicle is not in use.

15. The vehicle of claim 11 wherein the right wheel and the left wheel may detach from the tiltable platform when the vehicle is not in use.

16. The vehicle of claim 11 wherein the planar position of the top surface of the tiltable platform relative to the horizontal plane indicates the direction of movement of the vehicle.

17. A vehicle comprising:
a tiltable platform for receiving a rider's feet, wherein, when the vehicle is in a neutral position, a top surface of the tiltable platform is coplanar with a horizontal plane, wherein the tiltable platform is configured to tilt in at least four directions;
a first right wheel in communication with a right motor, wherein the tiltable platform is connected to the right wheel; and
a first left wheel in communication with a left motor, wherein the tiltable platform is connected to the left wheel,
wherein a planar position of the top surface of the tiltable platform relative to the horizontal plane indicates the acceleration of the vehicle and the right wheel and the left wheel may fold under the tiltable platform when the vehicle is not in use.

* * * * *